United States Patent [19]

Gavrilov et al.

[11] Patent Number: 4,734,178

[45] Date of Patent: Mar. 29, 1988

[54] PROCESS FOR DEPOSITION OF A WEAR-RESISTANT COATING ONTO A CUTTING TOOL MADE FROM A CARBON-CONTAINING MATERIAL

[75] Inventors: Alexei G. Gavrilov, Domodedovo, Moskovskoi; Galina K. Galitskaya, Moscow; Viktor P. Zhed, Moscow; Elena I. Kurbatova, Moscow; Andrei K. Sinelschikov, Moscow, all of U.S.S.R.

[73] Assignee: Vsesojuzny Naucho-Issledovatelsky Instrumentalny Institut, Moscow, U.S.S.R.

[21] Appl. No.: 929,066

[22] Filed: Nov. 7, 1986

[51] Int. Cl.[4] .............................................. C23C 14/22
[52] U.S. Cl. ............................... 204/192.38; 427/37; 427/283
[58] Field of Search .......... 204/192.1, 192.15, 192.38, 204/298; 427/37, 38, 39, 283; 156/621

[56] References Cited

U.S. PATENT DOCUMENTS

| | | | |
|---|---|---|---|
| 3,783,231 | 1/1974 | Sablev et al. | 219/123 |
| 3,793,179 | 2/1974 | Sablev et al. | 204/298 |
| 3,993,802 | 11/1976 | Polichette et al. | 427/283 X |

Primary Examiner—G. L. Kaplan
Assistant Examiner—Nam X. Nguyen
Attorney, Agent, or Firm—Burgess, Ryan and Wayne

[57] ABSTRACT

A process for deposition of a wear-resistant coating onto a cutting tool made from a carbon-containing material by condensation of a substance by bombardment with ions of a cathode material evaporated in a vacuum chamber by means of an arc discharge, wherein prior to placing the cutting tool into the vacuum chamber it is immersed into a saturated solution of a salt, kept therein for 5 to 10 min and the solvent is evaporated till crystallization of the salt on the cutting tool surface occurs; heating of the cutting tool by ion bombardment is effected first to the temperature of decomposition of the salt crystals, whereafter the arc discharge is switched-off, the cutting tool is kept for 15 to 30 seconds, the arc discharged is re-energized and the heating is continued to the temperature of carbidization of the evaporated cathode material.

12 Claims, No Drawings

PROCESS FOR DEPOSITION OF A WEAR-RESISTANT COATING ONTO A CUTTING TOOL MADE FROM A CARBON-CONTAINING MATERIAL

FIELD OF THE INVENTION

The present invention relates to metal-working, more specifically to cutting tools with a wear-resistant coating and, in particular to a process for deposition of a wear-resistant coating onto a cutting tool.

The process for deposition of a wear-resistant coating onto a cutting tool is employed for various cutting tools manufactured from a carbon-containing material, e.g. high-speed steel, hard alloys, such as drills, cutters, mills operating under conditions of increased loads.

BACKGROUND OF THE INVENTION

At present one of the routes for extending the service life of a cutting tool with a wear-resistant coating made of refractory intrusion phase such as TiC or TiN resides in improving the exploitation characteristics of the wear-resistant coating itself, in particular its hardness and resistance. To this end, alloying components are incorporated in the coating composition; as such components use is generally made of transition metals of IV-VIa Groups such as zirconium, molybdenum or tungsten.

Known in the art is a process for deposition of a wear-resistant coating onto a cutting tool comprising carbon-containing material [(cf. FRG Pat. No. 1,521,166 Int. Cl.$^2$ C 23 C 17/00, published July 24, 1969)]. This wear-resistant coating contains crystals of tungsten carbide mixed in any ratio with crystals of titanium carbide, vanadium carbide, tantalum carbide or niobium carbide. A coating from mixed crystals is formed as a result of a reaction between transition metals preliminarily deposited on the surface of a cutting tool such as titanium, vanadium tantalum and niobium or alloys thereof and tungsten carbide incorporated in the material of the cutting tool body. This reaction involves the formation of a coating from mixed crystals takes place upon heating of a cutting tool in vacuum or in the atmosphere of a protective gas at a temperature of about 900° C.

These metals are deposited onto the cutting tool surface prior to the formation of a wear-resistant coating by various methods, for example by electroplating or vacuum deposition.

However, a wear-resistant coating can be deposited only on a cutting tool made from hard alloys. For a cutting tool manufactured from an alloy having a lower melting point as compared to hard alloys, e.g. from a high-speed steel, this process is inapplicable.

Furthermore, the number of compositions of thus-produced wear-resistant coating is limited by the reactivity of tungsten carbide which does not substantially react with elements of Groups I—III such as K, Na, Ba, Ca and Al.

Also known in the art is a process for deposition of a wear-resistant coating onto a cutting tool by way of condensation of a substance through ion bombardment. [(cf. Journal "Physics and Chemistry of Material Processing", "Nauka" Publishers, No. 2, 1979, pp. 169–170)]. enabling deposition of a wear-resistant coating not only on hard alloys, but also on tool materials having a lower melting point as compared to hard alloys, i.e. high-speed steels. It involves the following operations: placing a cutting tool in a vacuum chamber, energizing an arc discharge for evaporation of the cathode material, applying a biasing voltage to the cutting tool, heating the cutting tool by bombardment with ions of the evaporated cathode material and formation of a wear-resistant coating through interaction of ions of the evaporated cathode materials with a gas-reactant admitted into the vacuum chamber. In other words, deposited onto the cutting tool is a wear-resistant coating incorporating the components which are present in the compositions of the cathode material and of the gas-reactant. As is known, a cathode is usually made from transition metals of Groups IVa–VIa or alloys thereof, while as the gas-reactant use is made of nitrogen, borane or methane. The thus-produced wear-resistant coating based on refractory intrusion phases such as TiC or TiN has a high hardness and brittleness. To improve the characteristics of the wear-resistant coating, in particular its service life, it is necessary that it have in addition to hardness, plasticity and lubricating properties as well. These properties might be inherent in a coating which incorporates, for example, elements of Groups I–III, as well as Te, Se, Ce, F, Os. However, it is substantially impossible to introduce elements of Groups I–III into the composition of the evaporated cathode material due to their physico-chemical phoperties and specific features of the process of application of a coating by condensation of the substance by ionic bombardment.

Owing to a low melting temperature of elements of these groups, e.g. lithium has a m.p. of 180° C. and sodium—98° C., a fusion of the cathode takes place upon burning of the arc discharge in the vacuum chamber which results in disturbance of conditions of the process for deposition of a coating.

During evaporation of the cathode material the cathode should be cooled with water. For this reason, elements of Group I reacting with water with the formation of an alkali and hydrogen cannot be incorporated into the cathode material, since it creates the risk of an explosion.

Furthermore, it is substantially impossible to make a cathode from a number of materials possessing an insignificant mutual solubility of forming immiscible liquid solutions.

It is also substantially impossible to simultaneously evaporate, by means of an arc discharge, metals incorporated in the cathode composition having ionization potentials essentially differing from one another.

It is neither possible to make cathodes or introduce into the cathode material liquid (mercury) and powder-like (boron, phosphorus) components.

Moreover, it is inadvisable to make cathodes from noble and rare-earth metals such as platinum and lanthanum.

The present invention provides a process for deposition of a wear-resistant coating onto a cutting tool from a carbon-containing material whereby a preliminary treatment of the cutting tool and heating conditions by ion bombardment make it possible to extend longevity of the wearresistant coating and, thereby, the service life of the cutting tool.

SUMMARY OF THE INVENTION

It is an object of the present invention to provide a process for deposition of a wear-resistant coating onto a cutting tool made from a carbon-containing material which make it possible to extend the service life of the cutting tool.

This object is accomplished by that in a process for deposition of a wear-resistant coating onto a cutting tool from a carbon-containing material comprising placing the cutting tool in a vacuum chamber, energizing an arc discharge therein for evaporation of the cathode material, heating of the cutting tool by bombardment with ions of the evaporated cathode material and forming the wear-resistant coating by reacting ions of the evaporated cathode material with a gas reactant admitted into the vacuum chamber, in accordance with the present invention, prior to placing the cutting tool into the vacuum chamber it is immersed into a saturated solution of a salt containing a cation of Na, K, Ag, Ca, Ga, Tl, La, Ce or Ta and/or an anion incorporating B, Se, Te, S, Re, Ru, Os Pt or W, kept in this solution for 5 to 10 minutes at the temperature of the saturated solution of the salt and the solvent is evaporated till the salt is crystallized on the cutting tool surface; the cutting tool heating by bombardment with ions of the vaporated cathode material is effected first to the temperature of decomposition of the salt crysals, whereafter the arc discharge is de-energized, the cutting tool is kept at this temperature for 15 to 30 seconds, then the arc discharge is re-energized and the heating is continued till the temperature of carbidization of the evaporated cathode material is reached.

This process for deposition of a wear-resistant coating onto a cutting tool made from a carbon-containing material makes it possible to improve exploitation characteristics of the wear-resistant coating and to extend the service life of the cutting tool by at least 1.5 times. The improvement of the longevity of the cutting tool results from the formation, on its surface, of a sublayer from mixed crystals, a part of which diffuses into the coating during its condensation, thus alloying and reinforcing it, while a portion of crystals is melted or softened and fills roughness recesses on the cutting tool surface. During operation of the cutting tool its resistance is increased due to betterment of physiocochemical properties of the wear-resistant coating. Simultaneously with an improved hardness, the coating plasticity and antifriction properties are also ameliorated due to the presence, in the wear-resistant coating, of the components having plasticity, as well as the components exhibiting lubricating properties.

The present invention is further illustrated by the specific examples showing particular embodiments.

The advantages of the present invention will now become more fuly apparent from the following specific examples of its implementation.

DETAILED DESCRIPTION OF THE INVENTION

The process for deposition of a wear-resistant coating on the cutting tool resides in the following. First a cutting tool is manufactured from a carbon-containing material, for example from high-speed steels, hard alloys.

Then the cutting tool is placed into a saturated solution of a salt, e.g. a solution of borax in water and kept therein for 5 to 10 minutes at the temperature of the saturated solution. This results in deposition of hydrated ions of the salt on the surface of the cutting tool. Use can be made of saturated solutions of any salts; ordinary salts, complex salts or organometal salts incorporating in their composition cations of Na, K, Ag, Ca, Ga, Tl, La, Ce or Ta and/or an anion containing B, Se, Te, S, Re, Ru, Os, Pt or W. Use can be made of both naturally occurring salts and salts obtained in the laboratory.

Depending on the salt type employed an appropriate solvent is used including: water or organic solvents such as acetone, ethanol.

The saturated salt solution is prepared at the temperature of dissolution of each particular salt in a given specific solvent.

The solution should be saturated to ensure deposition of a maximum possible amount of the salt ions on the cutting tool surface. When oversaturated solutions are used, the deposition process is hindered by the presence therein of the second phase lowering the amount of ions being deposited on the cutting tool surface and disturbing the uniformity of their distribution over the surface.

Residence of the cutting tool in the saturated salt solution is effected at the temperature of dissolution of each particular salt in order to retain a constant concentration of ions in the solution and to prevent the precipitation of the second phase from the solution. To maintain the solution at a constant temperature it is heated, when required, by any conventional method.

An optimal time of residence of the cutting tool in the salt solution is established experimentally. At a residence time of less than 5 minutes the amount of the salt ions deposited on the cutting tool surface does not provide any substantial effect on extension of the service life of the wear-resistant coating. At a residence time longer than 10 minutes no further extension of the service life is attained.

The tool is removed from the salt solution and the solvent is evaporated till the salt is crystallized on the cutting tool surface. Depending on the solvent employed, it is evaporated either naturally, in the air at the ambient temperature, or under heating to the temperature of crystallization of the salt.

If the temperature at which crystallization of the salt from solution is effected is below the crystallization temperature, the obtained crystals contain an excessive amount of crystallization water or residual amounts of the solvent are present on the cutting tool surface which is undesirable, since upon a further application of a wear-resistant coating in the chamber the residual impurities change the coating composition and impair resistance of the cutting tool.

If the temperature of crystallization of the salt is above the crystallization temperature, the salt can partly decompose outside the chamber thus also resulting in an impaired resistance of the tool.

Then the cutting tool is placed into a vacuum chamber with a cathode provided therein and containing at least one transition metal of Groups IVa–VIa to be incorporated into the composition of a wear-resistant coating. Most frequently this cathode is made from Ti or Ti-based alloys. Other cathodes can be also mounted in the vacuum chamber, provided that other metals of the above-mentioned groups an be incorporated in the composition of the wear-resistant coating.

Thereafter the chamber is set under vacuum and an arc discharge is energized therein to ensure evaporation of the cathode material. A known biasing voltage of from 800 to 10,000 V is applied to the cutting tool and heating of its surface is effected by bombardment with ions of the evaporated cathode material. The heating is effected in two stages: first—to the temperature of decomposition of the salt crystals which temperature is controlled by means of a pyrometer. When this temperature is reached, the arc discharge is switched-off and the cutting tool is kept for 15 to 30 seconds to decompose the salt crystals into constituents. At a residence time less than 15 seconds the decomposed salt amount is insufficient to ensure an extended service life of the coating, whereas a further heating contributes to melting and evaporation of the remaining amount of the salt from the cutting tool surface.

At a residence time of more than 30 seconds the cutting tool starts to get chilled and the process of decomposition of the salt crystals thus stops. Then the arc discharge is re-energized and heating of the cutting tool is continued to the temperature of carbidization of the evaporated cathode material which is also controlled by means of a pyrometer.

Then the biasing voltage applied to the cutting tool is reduced to a value ensuring condensation of the evaporated cathode material on the cutting tool surface. This biasing voltage is known, and is varied within the range of from 25 to 750 V. At the same time a gas-reactant is admitted into the vacuum chamber to react with the evaporated cathode material with the formation of a wear-resistant coating. As the gas reactant nitrogen, methane, borane are used. The gas reactant is fed into the chamber under a pressure of from $5 \times 10^{-2}$ to $5 \times 10^{-5}$ mm Hg.

After the formation of the wear-resistant coating to the predetermined thickness defined by the time of admission of the gas reactant, its supply is stopped, the biasing voltage is switched-off from the cutting too, the arc discharge is deenergized and the cutting tool is cooled in the chamber to room temperature.

For a better understanding of the present inventiton some specific examples are given hereinbelow by way of illustration of its particulr embodiments.

EXAMPLE 1

Twist bits are manufactured from a high-speed steel of the following composition, % by mass: C—0.85, Cr—3.6, W—6.0, V—2.0, Mo—5.0, Fe—the balance. A lot of the drills cleaned from mechanical impurities and lubricants in the number of 10 pieces is placed into a vessel filled with a saturated solution of sodium salt of tetraboric acid $Na_2B_4O_7$ having a temperature of 30° C. The salt contains $Na^+$ cation and $(B_4O_7)^{--}$ anion incorporating B. At this temperature a saturated solution is prepared by dissolution of 3.75 g of borax in 100 g of water. Water is used as a solvent. The lot of drills is kept in the solution for 5 minutes, the solution temperature being maintained at 30° C. After residence the drills are placed into a furnace having temperature of 60° C, i.e. temperature of crystallization of borax from solution, heated to this temperature and the solvent is evaporated.

Then the drills are put into a vacuum chamber of a known unit for deposition of coatings by ion bombardment condensation of a substance. The chamber is evacuated to the pressure of $5 \times 10^{-5}$ mm Hg and the biasing voltage of 1,200 V is applied to the drills. An arc discharge is energized in the chamber and a Ti-made cathode is evaporated. In this manner heating of the drill surface to the temperature of 400° C., i.e. the temperature of borax decomposition under Ti ion bombardment conditions known from the literature, is effected. Thereafter, the arc discharge is switched-off for 20 seconds. On expiration of this time the arc discharge is re-energized and heating of the drills by ion bombardment is continued to the temperature of 520° C., i.e. a known temperature of titanium carbidization under ion bombardment conditions. At this temperature titanium carbide is formed upon interaction of titanium with carbon of the material of drills, i.e. a high-speed steel.

Upon achievement of the carbidization temperature of titanium the biasing voltage on the drills is lowered to 350 V and nitrogen is admitted into the chamber. In doing so, the pressure in the chamber is $3 \times 10^{-3}$ mm Hg. Upon the reaction of nitrogen with titanium a wear-resisant titanium nitride coating is formed on the drill surface to the thickness of 5 μm. Thereafter the admission of nitrogen is stopped, the arc discharge is switched-off, the voltage from the tool is disconnected and the tool is cooled in the chamber to room temperature.

The resistance tests of the lot of drills of 5 mm diameter are carried out in drilling holes in a steel of the following composition: C—0.42-0.49% by weight, Fe—the balance on a vertical drilling machine is the presence of any known lubricating and cooling liquid under the following cutting conditions: speed v=45 m/min, feed S—0.18 mm/rev., drilling depth l=3d wherein d is the drill diameter. The criterion of blunting—squeaking of the drill. The average number of holes made by one drill is 390.

EXAMPLE 2

A lot of drills similar to those described in the foregoing Example 1 is manufactured and placed into a vessel filled with a saturated solution of potassium carbonate $K_2CO_3$ having temperature of 20° C. The salt contains $K^+$ cation. For the preparation of a saturated solution 113.5 g of the salt are dissolved in 100 g of water. The drills are kept in the solution for 7 min, while maintaining its temperature at 20° C. A further procedure is similar to that described in Example 1 hereinabove, except that the salt crystallization is carried out at the temperature of 40° C. and the heating of the drill surface by bombardment with ions of the evaporated cathode material in the first stage is conducted to the temperature of 400° C., i.e. temperature of decomposition of potassium carbonate under the ion bombardment conditions. Thereafter, the arc discharge is switched-off for 15 seconds. Further steps of the process are carried out as described in Example 1.

The resistance tests of drill lots are carried out following the procedure described in Example 1. The average number of holes made by a single drill is 420.

EXAMPLE 3

A lot of drills similar to those described in the foregoing Example 1 is manufactured and placed into a vessel filled with a solution of sodium nitrate $NaNO_3$ having temperature of 20° C. The salt contains $Na^+$ cation. For the preparation of a saturated solution 46.8 g of the salt are dissolved in 100 g of water. The drills are kept in this solution for 10 minutes, while maintaining the solution temperature at 20° C. Further steps of the process are carried out as described in Example 1 hereinbefore, except that the salt crystallization is conducted at the temperature of 30° C. and heating of the drill surface by bombardment with ions of the evaporated cathode material in the first stage is conducted to the temperature of 380° C., i.e. the temperature of decomposition of sodium nitrate under the ion bombardment conditions. Thereafter the arc discharge is switched-off for 25 seconds. Then the process is performed as described in Example 1 hereinbefore. The resistance tests of the drill lot are carried out as in Example 1. The average number of holes made by one drill is 350.

EXAMPLE 4

A lot of drills similar to those described in Example 1 is manufactured and placed into a vessel filled with a solution of lanthanum sulphate $La_2(SO_4)_3$ having temperature of 20° C. The salt contains $La^{+++}$ cation and $(SO_4)^{--}$ anion incorporating S. For the preparation of a saturated solution 3.9 g of the salt are dissolved in 100 g of acetone. The drills are kept in this solution for 10 minutes.

Further stages of the process are carried out as described in Example 1 hereinbefore, except that the solvent is evaporated by a natural way and the heating of the drill surface by bombardment with ions of the evaporated cathode material in the first stage is effected to the temperature of 450° C., i.e. the temperature of the salt decomposition under the ion bombardment conditions. Thereafter the arc discharge is switched-off for 25 seconds. The resistance tests of the drill lot are carried out as in Example 1. The average number of holes made by one drill is 300.

EXAMPLE 5

The process is carried out as described in Example 4, except that as the salt cerium sulphate is used. The salt $Ce_2(SO_4)_3$ contains $Ce^{+++}$ cation and $(SO_4)^{--}$ anion incorporating S. For the preparation of a saturated solution 15 g of the salt are used per 100 g of water at the temperature of 20° C. The solvent is evaporated at the temperature of 30° C. and the heating of the drill surface by bombardment with ions of the evaporated cathode material in the first stage is effected to the temperature of 500° C.

The resistance test of the drill lot are carried out as described in Example 1 hereinbefore. The average number of holes made by one drill is 340.

EXAMPLE 6

The process is conducted following the procedure described in the foregoing Example 4, except that tantalum chloride $TaCl_3$ is used as the salt. The salt contains $Ta^{+++}$ cation. For the preparation of the saturated solution 3.5 g of the salt are used per 100 g of water at the temperature of 70° C. The solvent is evaporated at the temperature of 30° C. and the heating of the drill surface by bombardment with ions of the evaporated cathode material in the first stage is effected to the temperature of 300° C.

The resistance tests of the drill lot are carried out as described in Example 1 hereinbefore. The average number of holes made with one drill is 346.

EXAMPLE 7

The process is conducted as described in Example 4, except that sodium sulphide $Na_2S$ is used as the salt. The salt contains $Na^+$ cation and $S^{--}$ anion. For the preparation of a saturated solution 18.06 g of the salt are used per 100 g of water at the temperature of 50° C. The solvent is evaporated at the temperature of 50° C. and the heating of the drill surface by bombardment with ions of the evaporated cathode material in the first stage is effected to the temperature of 150° C.

The resistance tests of the drill lot are carried out as described in Example 1 hereinbefore. The average number of holes made by one drill is 352.

EXAMPLE 8

The process is conducted as in Example 4, except that as the salt sodium telluride $Na_2Te$ is used. The salt cotains $Na^+$ cation and $Te^{--}$ anion. For the preparation of a saturated solution 15 g of the salt are used per 100 g of water at the temperature of 20° C. The solvent is evaporated at the temperature of 50° C. and the heating at the first stage is effected to the temperature of 200° C.

The resistance tests of the drill lot are carried out as described in Example 1. The average number of holes made by one drill is 369.

EXAMPLE 9

The process is conducted as described in Example 4, except that as the salt sodium selenide $Na_2Se$ is used. The salt contains $Na^+$ cation and $Se^{--}$ anion. For the preparation of a saturated solution 13.2 g of the salt are used for 100 g of water at the temperature of 20° C. The solvent is evaporated at the temperature of 50° C. and the heating of the drill surface by bombardment with ions of the evaporated cathode material in the first stage is effected to the temperature of 230° C.

The resistance tests of the drill lot are conducted as described in Example 1 hereinbefore. The average number of holes made by one drill is 345.

EXAMPLE 10

The process is conducted as described in Example 4, except that as the salt potassium perrhenate $KReO_4$ is used. The salt contains $K^+$ cation and $(ReO_4)^-$ anion incorporating Re. For the preparation of a saturated solution 6.34 g of the salt are used per 100 g of water at the temperature of 20° C. The solvent is evaporated at the temperature of 100° C. and the heating of the drill surface by bombardment with ions of the evaporated cathode material in the first stage is effected to the temperature of 250° C.

The resistance tests of the drill lot are carried out as described in Example 1 hereinbefore. The average number of holes made with one drill is 285.

EXAMPLE 11

The process is conducted as described in Example 4, except that as the salt potassium hexacyanoruthenate $K_4[Ru(CN)_6]$ is used. The salt contains $K^+$ cation and $[Ru(CN)_6]^{---}$ anion incorporating Ru. For the preparation of a saturated solution 30 g of the salt are used per 100 g of water at the temperature of 80° C. The solvent is evaporated at the temperature of 100° C. and the heating of the drill surface in the first stage by bombardment with ions of the vaporated cathode material is carried out to the temperature of 220° C.

The resistance tests of the drill lot are effected as described in Example 1 hereinbefore. The average number of holes made by one drill is 310.

EXAMPLE 12

The process is conducted as in Example 4, except that potassium hexacyanoosmate is used as the salt—$K_4[Os(CN)_6]$. The salt contains $K^+$ cation and $[Os(CN)_6]^{---}$ anion incorporating Os. For the preparation of a saturated solution 22 g of the salt are used per 100 g of water at the temperature of 80° C. The solvent is evaporated at the temperature of 100° C. and the heating of the drill surface by bombardment with ions of the evaporated cathode material in the first stage is effected to the temperature of 240° C.

The resistance tests of the drill lot are conducted as described in Example 1. The average number of holes made by one drill is 380.

EXAMPLE 13

The process is conducted as described in Example 4, except that as the salt use is made of potassium tetracyanoplatinate $K_2[Pt(CN)_4]$. The salt contains $K^+$ cation and $[Pt(CN)_4]^{---}$ anion incorporating Pt. For the preparation of a saturated solution 18 g of the salt are used per 100 g of acetone at the temperature of 38° C. The solvent was evaporated in a natural way and the heating of the drill surface by bombardment with ions of the evaporated cathode material in the first stage is carried out to the temperature of 200° C.

The resistance tests of the drill lot are conducted as described in Example 1 hereinbefore. The average number of holes made by one drill is 334.

EXAMPLE 14

The process is conducted as described in Example 4, except that as the salt potassium thiocyanate KNCS is used. The salt contains $K^+$ cation and $NCS^-$ anion incorporating S. For the preparation of a saturated solution 217 g of the salt are used per 100 g of water at the temperature of 20° C. The solvent is evaporated at the temperature of 30° C. and heating of the drill surface by bombardment with ions of the evaporated cathode material in the first stage is effected to the temperature of 120° C.

The resistance tests of the drill lot are carried out as described in Example 1. The average number of holes made by one drill is 395.

EXAMPLE 15

The process is carried out as described in Example 4, except that as the salt lithium hexachloroplatinate $Li_2[Pt(Cl)_6]$ is used. The salt contains anion $[Pt(Cl)_6]^{--}$ incorporating Pt. For the preparation of a saturated solution 56 g of the salt are taken per 100 g of water at the temperature of 20° C. The solvent is evaporated in a natural manner and the heating of the drill surface by bombardment with ions of the evaporated cathode material in the first stage is effected to the temperature of 450° C.

The resistance tests of the drill lot are carried out as described in Example 1 hereinbefore. The average number of holes made by one drill is 527.

EXAMPLE 16

The process is conducted as in Example 4, except that as the salt magnesium sulphate $MgSO_4$ is used. The salt contains $(SO_4)^{--}$ anion incorporating S. For the preparation of a saturated solution 35.6 g of the salt are used per 100 g of water at the temperature of 20° C. The solvent is evaporated at the temperature of 70° C. and the heating of the drill surface by bombardment with ions of the evaporated cathode material in the first stage is effected to the temperature of 250° C.

The resistance tests of the drill lot are conducted as described in Example 1. The average number of holes made by one drill is 310.

EXAMPLE 17

The process is conducted as described in Example 4, except that as the salt beryllium sulphate $BeSO_4$ is used.

The salt contains $(SO_4)^{--}$ anion incorporating S. For the preparation of a saturated solution 40 g of the salt are used per 100 g of water at the temperature of 20° C. The solvent is evaporated at the temperature of 30° C. and the heating of the drill surface by bombardment with ions of the evaporated cathode material in the first stage is effected to the temperature of 340° C.

The resistance tests of the drill lot are effected as described in Example 1. The average number of holes made by one drill is 346.

EXAMPLE 18

A lot of drills similar to those described in the foregoing Example 1 is manufactured and placed into a vessel filled with a saturated solution of gallium sulphate $Ga_2(SO_4)_3$ having temperature of 20° C. The salt contains Ga cation and $SO_4^{--}$ anion incorporating S. For the preparation of a saturated solution 15 g of the salt are used per 100 g of water. The drills are kept in the solution for 10 minutes, while maintaining the solution at the temperature of 20° C. Then the process is carried out as described in Example 1, except that the salt crystallization is conducted at the temperature of 40° C. and the heating of the drill surface by bombardment with ions of the evaporated cathode material in the first stage is effected to the temperature of 450° C., i.e. the temperature of the salt decomposition under the ion bombardment conditions; the arc discharge is switched-off for 30 seconds.

The resistance tests of the drills are carried out as described in Example 1. The average number of holes made by one drill is 400.

EXAMPLE 19

A lot of drills similar to those described in Example 1 is manufactured and placed into a vessel filled with a saturated solution of sodium tungstate $Na_2WO_4$ having temperature of 20° C. The salt contains $Na^+$ cation and $(WO_4)^{--}$ anion incorporating W. For the preparation of a saturated solution 72 g of the salt are used per 100 g of water. The drills are kept in the solution for 10 minutes while maintaining the solution temperature at 20° C. Then the process is conducted in much the same manner as described in Example 1, except that the salt crystallization is conducted at the temperature of 80° C. and the heating of the drill surface by bombardment with ions of the evaporated cathode material in the first stage is effected to the temperature of 200° C. and the arc discharge is switched-off for 10 seconds.

The resistance tests of the drill lot are conducted as described in Example 1. The average number of holes made by one drill is 340.

EXAMPLE 20

A lot of cutting plates is manufactured in the amount of 10 pieces from—hard alloy of the following composition: titanium carbide TiC—15% by weight, cobalt Co—6% by weight, tungsten carbide—WC—the balance. The cleaned plates are placed into a vessel filled with a saturated solution of calcium nitrate $Ca(NO_3)_2$ having temperature of 20° C. The salt contains $Ca^{++}$ cation. The saturated solution is obtained by dissolving 121 g of the salt in 100 g of water. The lot of the plates is kept in the solution for 5 minutes while maintaining the solution temperature at 20° C. After residence in the solution the plates are placed into a furnace and the solvent is evaporated at the temperature of 35° C. Then the plates are transfered to a vacuum chamber of a unit for coating application by condensation of a substance by ion bombardment. The chamber is set under vacuum of $5 \times 10^{-5}$ mm Hg and the biasing voltage of 1,500 V is applied onto the plates. An arc discharge is energized in the chamber and a cathode made from titanium is evaporated. In this manner the plate surface is heated by bombardment with titanium ions to the temperature of 100° C., i.e. to the temperature of the salt decomposition under the ion bombardment conditions. Thereafter the arc discharge is switched-off for 20 seconds. Then it is again energized and the heating of the plates is continued to the temperature of 650° C., i.e. the temperature of formation of titanium carbide upon interaction of titanium with carbon of the plate material. Thereafter the biasing voltage is lowered to 300 V and nitrogen is admitted into the chamber to the pressure of $2 \times 10^{-3}$ mm Hg therein. Upon the reaction of nitrogen with titanium a 6 μm thick wear-resistant coating of titanium nitride is formed on the surface of the cutting plates. Thereafter the admission of nitrogen is stopped, the arc discharge is disconnected, the voltage is switched-off from the plates which are then cooled in the chamber to room temperature.

The resistance tests of the plates are carried out in turning of a steel having the following composition: C—0.36–0.45% by weight, Fe—the balance, under the following cutting conditions: speed v—160 m/min, feed S—0.3 mm/rev., cutting depth 1–1 mm.

The resistance of the plates is determined by the number of workpieces machined by each plate till its wear. The average number of workpieces machined by one plate is 35.

EXAMPLE 21

A lot of cutting plates similar to those described in Example 20 is manufactured and placed into a vessel filled with a saturated solution of thallium nitrate $Tl(NO_3)_3$ the salt contains $Tl^{+++}$ cation having temperature of 20° C. For the preparation of a solution 9,55 g of the salt is used for 100 g of water. The drills are kept in the solution for 7 minutes while maintaining the solution temperature at 20° C. Then the process is carried out as described in Example 20, except that the salt crystallization is conducted at the temperature of 60° C. and the heating of the plate surface in the first stage is effected to the temperature of 200° C., the arc discharge is switched-off for 15 s.

The resistance tests are carried out following the procedure of Example 20. The average number of workpieces machined by one plate is 40.

EXAMPLE 22

A lot of cutting plates similar to those described in Example 20 is manufactured and placed into a vessel filled with a saturated wolution of silver acetate $AgC_2H_3O_3$ having temperature of 20° C. and kept therein for 10 minutes. The salt contains $Ag^+$ cation. For the preparation of a solution 1.04 g of the salt is used for 100 g of water. Then the process is conducted as described in Example 20 hereinbefore, except that the salt crystallization is conducted at the temperature of 50° C. and the heating in the first stage is effected to the temperature of 120° C., i.e. the salt decomposition temperature under the ion bombardment conditions.

The resistance tests of the plate lot are conducted as described in Example 20 hereinbefore. The average number of workpieces machined by one plate is 38.

What is claimed is:

1. A process for deposition of a wear-resistant coating onto a cutting tool made from a carbon-containing material comprising the following steps:
    (a) placing said cutting tool into a saturated solution of a salt containing a cation selected from the group consisting of Na, K, Ag, Ca, Ga, Tl, La, Ce, Ta in a contacting zone for a period of from 5 to 10 minutes;
    (b) removing said cutting tool from the contacting zone and evaporating the solvent from said saturated solution on the cutting tool to crystallize the salt on the surface of said cutting tool;
    (c) placing said cutting tool having the salt crystallized on the surface into a vacuum chamber provided with cathodes;
    (d) energizing an arc discharge in said vacuum chamber to evaporate a cathode material of at least one Group IVA, VA or VIA element of the Periodic Table;
    (e) heating said cutting tool by bombardment with ions of said evaporated cathode material to a temperature at which decomposition of said salt occurs to decompose the crystals of said salt;
    (f) switching-off said arc discharge and maintaining said cutting tool for from 15 to 30 seconds at said temperature at which decomposition of said salt occurs;
    (g) re-energizing said arc discharge and heating said cutting tool by bombardment with ions of the evaporated cathode material to a temperature of carbidization of said evaporated cathode material;
    (h) introducing a gas reactant into said vacuum chamber and reacting the ions of the evaporated cathode material with said gas reactant to form the wear-resistant coating on the cutting tool.

2. A process for deposition of a wear-resistant coating onto a cutting tool of claim 1, wherein said salt contains an anion having incorporated therein an element selected from the group consisting of B, Se, Te, S, Re, Ru, Os, Pt and W.

3. The process of claim 2 wherein the cutting tool is heated by bombardment with ions biased at a voltage of from 800 to 10,000 volts.

4. The process of claim 2 wherein the evaporated cathode material is condensed on the surface of the cutting tool at a bias voltage of from 25 to 750 volts.

5. The process of claim 2 wherein the gas reactant is selected from nitrogen, methane and borane.

6. The process of claim 1 wherein the cutting tool is heated by bombardment with ions biased at a voltage of from 800 to 10,000 volts.

7. The process of claim 1 wherein the evaporated cathode material is condensed on the surface of the cutting tool at a bias voltage of from 25 to 750 volts.

8. The process of claim 1 wherein the gas reactant is selected from nitrogen, methane and borane.

9. A process for deposition of a wear-resistant coating onto a cutting tool made from a carbon containing material comprising the following steps:
    (a) placing said cutting tool into a saturated solution of a salt containing an anion having incorporated therein B, Se, Te, S, Re, Ru, Os, Pt, W in a contacting zone for a period of from 5 to 10 minutes;
    (b) removing said cutting tool from the contacting zone and evaporating the solvent from said saturated solution on the cutting tool to crystallize the salt on the surface of said cutting tool;

(c) placing said cutting tool having the salt crystallized on the surface into a vacuum chamber provided with cathodes;

(d) energizing an arc discharge in said vacuum chamber to evaporate a cathode material of at least one Group IVA, VA or VIA element of the Periodic Table;

(e) heating said cutting tool by bombardment with ions of said evaporated cathode material to a temperature at which decomposition of salt occurs to decompose the crystals of said salt;

(f) switching-off said arc discharge and maintaining said cutting tool for from 15 to 30 seconds at said temperature at which decomposition of said salt occurs;

(g) re-energizing said arc discharge and heating said cutting tool by bombardment with ions of the evaporated cathode material to a temperature of carbidization of said evaporated cathode material;

(h) introducing a gas reactant into said vacuum chamber and reacting the ions of the evaporated cathode material with said gas reactant to form the wear-resistant coating on the cutting tool.

10. The process of claim 9 wherein the cutting tool is heated by bombardment with ions biased at a voltage of from 800 to 10,000 volts.

11. The process of claim 9 wherein the evaporated cathode material is condensed on the surface of the cutting tool at a bias voltage of from 25 to 750 volts.

12. The process of claim 9 wherein the gas reactant is selected from nitrogen, methane and borane.

* * * * *